(12) United States Patent
Mathew et al.

(10) Patent No.: US 8,455,919 B2
(45) Date of Patent: Jun. 4, 2013

(54) HIGH DENSITY THYRISTOR RANDOM ACCESS MEMORY DEVICE AND METHOD

(75) Inventors: Suraj J. Mathew, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 202 days.

(21) Appl. No.: 12/838,803

(22) Filed: Jul. 19, 2010

(65) Prior Publication Data

US 2012/0012892 A1    Jan. 19, 2012

(51) Int. Cl.
*H01L 21/332*    (2006.01)
*H01L 29/66*    (2006.01)

(52) U.S. Cl.
USPC ............ 257/175; 257/E27.79; 438/133

(58) Field of Classification Search
USPC ............ 257/175, E27.079; 438/133
See application file for complete search history.

(56) References Cited

U.S. PATENT DOCUMENTS

| | | | |
|---|---|---|---|
| 6,686,612 B1 | 2/2004 | Horch et al. | |
| 6,953,953 B1 * | 10/2005 | Horch | 257/133 |
| 6,980,457 B1 | 12/2005 | Horch et al. | |
| 7,183,590 B2 | 2/2007 | Zheng et al. | |
| 7,351,614 B1 * | 4/2008 | Horch | 438/135 |
| 7,655,973 B2 | 2/2010 | Mauli | |
| 2002/0190265 A1 | 12/2002 | Hsu | |
| 2007/0096203 A1 | 5/2007 | Mouli | |
| 2009/0179262 A1 | 7/2009 | Holz | |
| 2009/0219426 A1 * | 9/2009 | Mouli | 348/308 |

FOREIGN PATENT DOCUMENTS

| | | |
|---|---|---|
| TW | 201214679 | 4/2012 |
| WO | WO-2012012435 | 1/2012 |

OTHER PUBLICATIONS

Slesazeck, Stefan, et al., "Vertical Capacitor-less Thyristor Cell for 30nm Stand-alone DRAM", The Institute of Electrical and Electronics Engineers (IEEE), [Online] 2009 Symposium on VLSI Technology Digest of Technical Papers, 978-4-86348-009-4, (2009), 2 pgs.
"International Application Serial No. PCT/US2011/044546, Search Report mailed Feb. 28, 2012", 3 pgs.
"International Application Serial No. PCT/US2011/044546, Written Opinion mailed Feb. 28, 2012", 4 pgs.

* cited by examiner

*Primary Examiner* — Jarrett Stark
*Assistant Examiner* — Nicholas Tobergte
(74) *Attorney, Agent, or Firm* — Schwegman, Lundberg & Woessner, P.A.

(57) ABSTRACT

Memory devices and methods of making memory devices are shown. Methods and configurations as shown provide folded and vertical memory devices for increased memory density. Methods provided allow trace wiring in a memory array to be formed on or near a surface of a memory device.

14 Claims, 4 Drawing Sheets

US 8,455,919 B2

HIGH DENSITY THYRISTOR RANDOM ACCESS MEMORY DEVICE AND METHOD

BACKGROUND

Thyristor random access memory (TRAM) provides a memory structure that does not need an exclusive storage capacitor, separate from a select transistor, to store a memory state. However device configurations to date use a considerable amount of surface area. Improvements in device configuration are needed to further improve memory density. Further, it is desirable to form devices using manufacturing methods that are reliable and efficient.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and chemical, structural, logical, electrical changes, etc. may be made.

The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
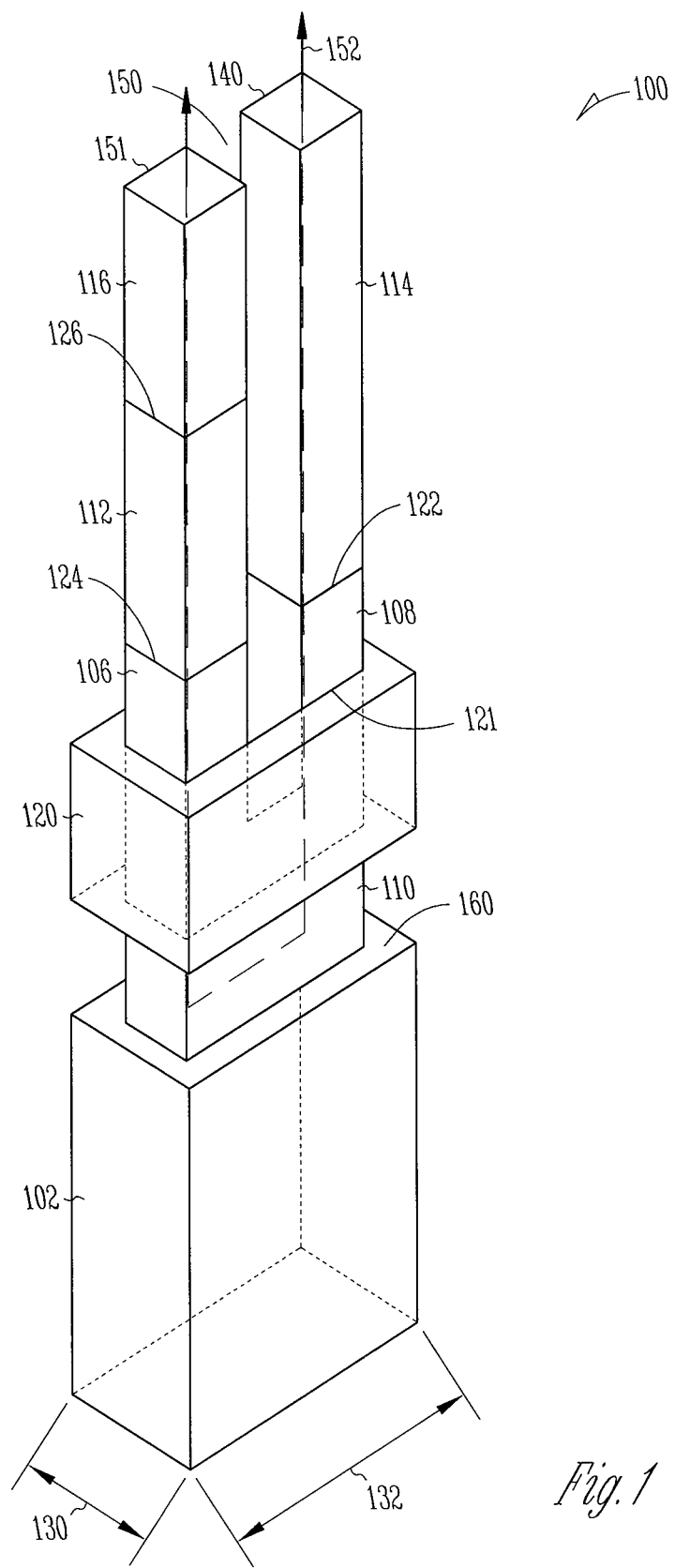
FIG. 1 shows an example memory cell according to an embodiment of the invention.

FIG. 1 shows a memory cell 100 according to an embodiment of the invention. The memory cell 100 includes a first type doped semiconductor base 110. The first type doped semiconductor base 110 is shown with two upward facing ends 106 and 108. As noted above, the term "upward" in the present specification is defined with respect to a semiconductor wafer during manufacture. A fabricated memory chip may have any of a number of possible orientations when in use. A space is included between the two upward facing ends 106 and 108. In one embodiment, the space defines a part of a conduction path 140, discussed in more detail below.

FIG. 1 further shows a second type doped semiconductor structure 112 coupled to a first of the upward facing ends 106, and another second type doped semiconductor structure 114 coupled to a second of the upward facing ends 108. In one embodiment, the first type doped semiconductor is p-type, and the second type doped semiconductor is n-type although the invention is not so limited. In other embodiments, the first type doped semiconductor is n-type, and the second type doped semiconductor is p-type.

Also shown is a first type doped semiconductor top structure 116 located over the second type doped semiconductor structure 112. The configuration shown in FIG. 1 forms a first p-n junction 122, a second p-n junction 124, and a third p-n junction 126. The p-n junctions (122, 124, 126) are coupled in series along a conduction path 140 to form a thyristor device.

In the configuration shown, the first type doped semiconductor base 110, along with the upward facing ends 106 and 108 define a folded structure. A folded structure is more compact in areal footprint than horizontal structures. In one embodiment, the areal footprint includes a width 130 and a length 132 that is approximately four lithographic feature squares ($4F^2$). Lithographic feature squares define how many devices or elements of devices can fit into a given area on a substrate when manufactured by optical lithography. The actual device dimensions may depend on several factors, including lithography and etch conditions. However, the relative figure of merit "F" is independent of wavelength, and is often used in the semiconductor industry to compare device architectures to one another for spatial efficiency.

The folded structure shown in FIG. 1 results in electrical contact points 151 and 152 being at a top surface of the memory cell 100. This allows subsequent wiring for a memory array to be formed on top of the memory cell instead of beneath the memory cell, or otherwise below a top surface 150 of the memory cell. Conductor traces or other wiring structures that are formed below a top surface 150 of a device can be more difficult to manufacture. For example, deep ion implant procedures, or deposition deep in an etched trench may be needed to form buried conductor wiring structures. In contrast, the memory cell 100, with the contact points 151 and 152 on the top surface, allow more reliable deposition processes for conductor wiring without deep trenches or ion implants.

FIG. 1 further illustrates an embodiment where the first type doped semiconductor base 110 is located on an insulator region 102. In one example, the insulator region 102 includes an oxide as the insulator material. In embodiments with an insulator region 102, a floating body region 160 is created at the base of the memory device 100. Embodiments with a floating body region 160 may show less charge leakage over embodiments formed directly on semiconductor material, without an insulator region.

In one example the insulator region 102 is an insulator region in a silicon-on-insulator (SOI) wafer. When using an SOI wafer, the first type doped semiconductor base 110 may be formed from a top semiconductor region in the wafer. In one example the top semiconductor region is provided as a p-doped region in the wafer form. In one example the top semiconductor region is doped during fabrication of the memory device 100.

In another example, the insulator region 102 is formed under individual memory devices 100 using a shallow trench isolation (STI) undercut operation. In one example of an STI undercut operation, trenches are etched adjacent to the memory device 100, and anisotropic etching is used to form an undercut region, that is subsequently filled, e.g. by deposition, with an insulator material, such as an oxide of silicon.

FIG. 1 further illustrates a gate 120 formed adjacent to at least one side of the first type doped semiconductor base 110. The example shown in FIG. 1 illustrates the gate 120 formed adjacent to four sides of the first type doped semiconductor base 110 to substantially surround the first type doped semiconductor base 110. In one embodiment, a gate insulator is formed at an interface 121 between the gate 120 and the first type doped semiconductor base 110.

In operation, application of a gate voltage to the gate 120 above a threshold value causes the first type doped semiconductor base 110 to invert and causes the second type doped semiconductor structure 114 to overcome the barrier of the first type doped semiconductor base 110 and connect to the second type doped semiconductor structure 112. Because of gate inversion, an anode to cathode voltage need not be high enough to cause avalanche generation, and therefore a snap back voltage resembles a diode turn-on. In one embodiment, a gate coupled base, e.g. gate 120, as illustrated, is used to modulate "write" voltage conditions of the memory device 100.

Figure 2:
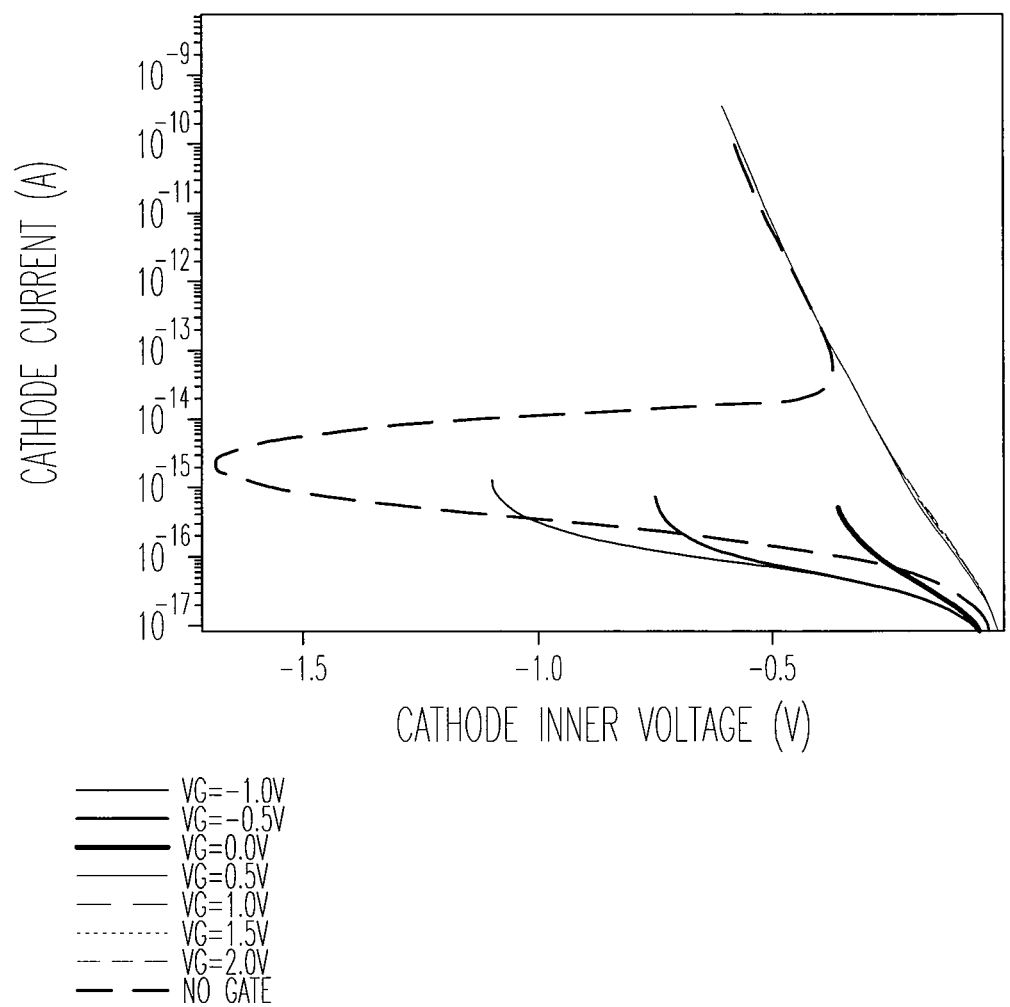
FIG. 2 shows trigger voltage of an example memory cell at various gate voltages according to an embodiment of the invention.

FIG. 2 illustrates a spectrum of gate voltages (VGs) and the effect on current versus applied voltage at the second type doped semiconductor structure 114. As can be seen in the example of FIG. 2, a higher anode to cathode voltage is needed to perform a "write" operation without the assistance of a gate trigger.

Figure 3:
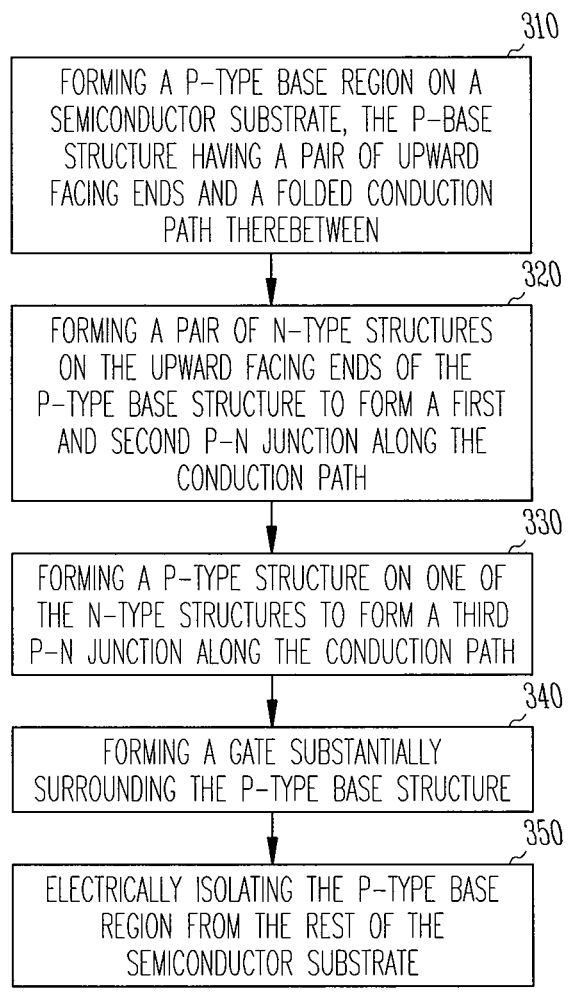
FIG. 3 shows an example method of forming a memory cell according to an embodiment of the invention.

FIG. 3 shows an example method of making a memory cell according to an embodiment of the invention. In operation 310, a p-type base region is formed on a semiconductor substrate. Operation 310 further describes forming a pair of upward facing ends in the p-type base region, with a folded conduction path between the pair of upward facing ends.

Operation 320 recites forming a pair of n-type structures over the upward facing ends of the p-type base structure to form first and second p-n junctions along the conduction path. As discussed above, although p-type base structure and n-type structures attached to the base structure are described, alternative doping arrangements are possible.

Operation 330 recites forming a p-type structure on one of the n-type structures to form a third p-n junction along the conduction path, and operation 340 recites forming a gate substantially surrounding the p-type base structure.

Operation 350 recites electrically isolating the p-type base region from the rest of the semiconductor substrate. In one example, electrical isolation is provided by forming the memory device 100 on an SOI substrate. In this example, the insulator region of the SOI substrate provides the electrical isolation, and at least the base region is formed from the surface semiconductor region of the SOI substrate. This example may use a small number of process steps, because the insulator region is part of the wafer, and does not need to be created during the manufacturing process. However, SOI wafers can cost more than silicon wafers. In another example, a silicon wafer is used, and an STI undercut operation is used to electrically isolate the memory device from the semiconductor substrate. This process may use more steps in manufacture, but the wafer can be less expensive.

Figure 4:
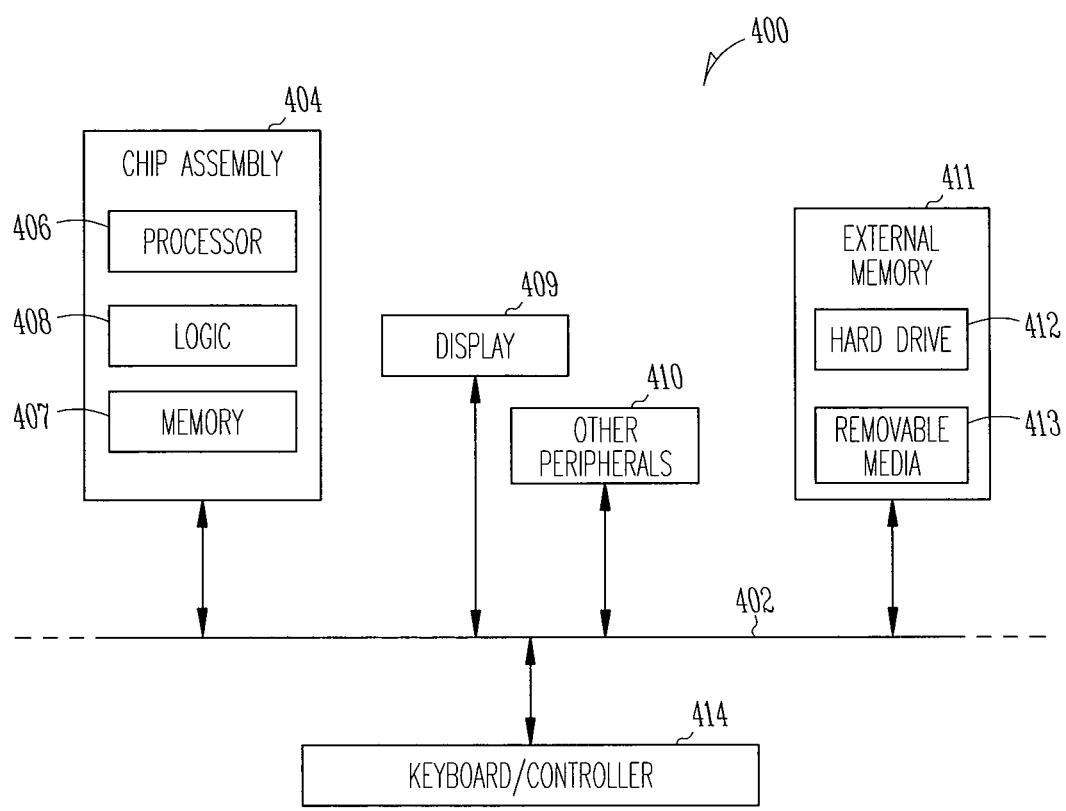
FIG. 4 shows an information handling system that includes an example memory cell according to an embodiment of the invention.

An embodiment of an information handling system such as a computer is included in FIG. 4 to show an embodiment of a high-level device application for the present invention. FIG. 4 is a block diagram of an information handling system 400 incorporating at least one chip or chip assembly 404 that includes memory cells according to embodiments of the invention as described above. Information handling system 400 is merely one embodiment of an electronic system in which the present invention can be used. Other examples include, but are not limited to, netbooks, cameras, personal data assistants (PDAs), cellular telephones, MP3 players, aircraft, satellites, military vehicles, etc.

In this example, information handling system 400 comprises a data processing system that includes a system bus 402 to couple the various components of the system. System bus 402 provides communications links among the various components of the information handling system 400 and may be implemented as a single bus, as a combination of busses, or in any other suitable manner.

Chip assembly 404 is coupled to the system bus 402. Chip assembly 404 may include any circuit or operably compatible combination of circuits. In one embodiment, chip assembly 404 includes a processor 406 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory chip 407 is included in the chip assembly 404. In one embodiment, the memory chip 407 includes a thyristor memory device as described in embodiments above.

In one embodiment, additional logic chips 408 other than processor chips are included in the chip assembly 404. An example of a logic chip 408 other than a processor includes an analog to digital converter. Other circuits on logic chips 408 such as custom circuits, an application-specific integrated circuit (ASIC), etc. are also included in one embodiment of the invention.

Information handling system 400 may also include an external memory 411, which in turn can include one or more memory elements suitable to the particular application, such as one or more hard drives 412, and/or one or more drives that handle removable media 413 such as floppy diskettes, compact disks (CDs), flash drives, digital video disks (DVDs), and the like. A memory constructed as described in examples above is included in the information handling system 400.

Information handling system 400 may also include a display device 409 such as a monitor, additional peripheral components 410, such as speakers, etc. and a keyboard and/or controller 414, which can include a mouse, trackball, game controller, voice-recognition device, or any other device that permits a system user to input information into and receive information from the information handling system 400.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory cell, comprising:
   a first type doped semiconductor base isolated from a substrate by an insulator region, the first type doped semiconductor base having two upward facing ends and a folded conduction path therebetween;
   a pair of second type doped semiconductor structures coupled vertically to the first type doped semiconductor base to form a first and second p-n junction along the conduction path;
   a first type doped semiconductor top structure to form a third p-n junction along the conduction path; and
   a gate adjacent to at least one side of the first type doped semiconductor base between the first and second p-n junctions.

2. The memory cell of claim 1, wherein the first type doped semiconductor is p-type doped and the second type doped semiconductor is n-type.

3. The memory cell of claim 1, wherein the first type doped semiconductor base is formed from a semiconductor region of a silicon-on-insulator substrate.

4. The memory cell of claim 1, wherein the memory cell uses an amount of substrate area of approximately $4F^2$.

5. A memory cell, comprising:
   a first type doped semiconductor base having two upward facing ends and a folded conduction path therebetween;
   a pair of second type doped semiconductor structures coupled vertically to the first type doped semiconductor base to form a first and second p-n junction along the conduction path;
   a first type doped semiconductor top structure to form a third p-n junction along the conduction path; and
   a gate substantially surrounding the first type doped semiconductor base between the first and second p-n junctions.

6. The memory cell of claim 5, wherein the gate includes a metal gate.

7. The memory cell of claim 5, wherein the a first type doped semiconductor base includes a p-type base.

8. The memory cell of claim 7, wherein the p-type base includes a floating body p-type base.

9. The memory cell of claim 5, wherein the memory cell is formed on a silicon-on-insulator wafer.

10. The memory cell of claim 5, wherein the first type doped semiconductor base is formed in a "U" shape.

11. A method, comprising:
    forming a p-type base region on a semiconductor substrate, the p-base structure having a pair of upward facing ends and a folded conduction path therebetween;
    forming a pair of n-type structures on the upward facing ends of the p-type base structure to form a first and second p-n junction along the conduction path;
    forming a p-type structure on one of the n-type structures to form a third p-n junction along the conduction path;
    forming a gate substantially surrounding the p-type base structure; and
    electrically isolating the p-type base region from the rest of the semiconductor substrate.

12. The method of claim 11, wherein forming the p-type base region on the semiconductor substrate includes forming the p-type base region from a top silicon region of a silicon-on-insulator substrate.

13. The method of claim 11, wherein electrically isolating the p-type base region from the rest of the semiconductor substrate includes isolating the p-type base region from the bulk silicon substrate using a shallow trench isolation undercut process.

14. The method of claim 11, wherein forming the p-type base region on a semiconductor substrate includes etching a trench part way through a p-type region to form a folded p-type base region having a pair of upward facing ends.

* * * * *

UNITED STATES PATENT AND TRADEMARK OFFICE
CERTIFICATE OF CORRECTION

PATENT NO. : 8,455,919 B2
APPLICATION NO. : 12/838803
DATED : June 4, 2013
INVENTOR(S) : Suraj J. Mathew et al.

It is certified that error appears in the above-identified patent and that said Letters Patent is hereby corrected as shown below:

In the Claims:

In column 6, line 1, in Claim 7, after "the" delete "a".

Signed and Sealed this
Twenty-fourth Day of September, 2013

Teresa Stanek Rea
*Deputy Director of the United States Patent and Trademark Office*